(12) United States Patent
Akiyama et al.

(10) Patent No.: US 8,169,023 B2
(45) Date of Patent: May 1, 2012

(54) POWER SEMICONDUCTOR DEVICE

(75) Inventors: Miwako Akiyama, Tokyo (JP); Yusuke Kawaguchi, Kanagawa-ken (JP); Yoshihiro Yamaguchi, Saitama-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 268 days.

(21) Appl. No.: 12/502,759

(22) Filed: Jul. 14, 2009

(65) Prior Publication Data

US 2010/0013010 A1 Jan. 21, 2010

(30) Foreign Application Priority Data

Jul. 16, 2008 (JP) ................................. 2008-184822

(51) Int. Cl.
*H01L 29/76* (2006.01)
*H01L 31/062* (2012.01)

(52) U.S. Cl. ........ 257/341; 257/342; 257/330; 257/329; 257/328; 438/270

(58) Field of Classification Search .......... 257/341–342, 257/328–330, E29.262, E29.257; 438/270
See application file for complete search history.

(56) References Cited

U.S. PATENT DOCUMENTS

| 7,582,519 B2 * | 9/2009 | Kocon et al. .................. 438/197 |
| 7,982,265 B2 * | 7/2011 | Challa et al. .................. 257/341 |
| 2006/0108634 A1 | 5/2006 | Miura |
| 2006/0244056 A1 | 11/2006 | Miura |
| 2007/0023793 A1 | 2/2007 | Yamaguchi et al. |
| 2008/0283909 A1 | 11/2008 | Akiyama et al. |

FOREIGN PATENT DOCUMENTS

| JP | 11-354788 | 12/1999 |
| JP | 2003-318396 | 11/2003 |
| WO | WO 03-046999 A1 | 6/2003 |

\* cited by examiner

*Primary Examiner* — Theresa T Doan
(74) *Attorney, Agent, or Firm* — Patterson & Sheridan, LLP

(57) ABSTRACT

An impurity concentration profile in a vertical direction of a p type base contact layer of a power semiconductor device has a two-stage configuration. In other word, the impurity concentration profile is highest at an upper face of the p type base contact layer, has a local minimum value at a position other than the upper face and a lower face of the base contact layer, and has a local maximum value at a position lower than the position of the local minimum value.

20 Claims, 7 Drawing Sheets

IMPURITY CONCENTRATION

IMPURITY CONCENTRATION

IMPURITY CONCENTRATION

IMPURITY CONCENTRATION

POWER SEMICONDUCTOR DEVICE

CROSS-REFERENCE TO RELATED APPLICATIONS

This application is based upon and claims the benefit of priority from the prior Japanese Patent Application No. 2008-184822, filed on Jul. 16, 2008; the entire contents of which are incorporated herein by reference.

BACKGROUND OF THE INVENTION

1. Field of the Invention

The present invention relates to a vertical trench-gate power semiconductor device.

2. Background Art

Photolithography steps are reduced when forming the source of a trench-gate vertical MOSFET (Metal Oxide Semiconductor Field Effect Transistor, hereinbelow referred to as "UMOS") by using a structure in which a base trench is formed in a region between trench gate electrodes, a base contact layer is formed at the bottom face of the base trench, and a portion of a source electrode is filled into an interior of the base trench (for example, refer to JP-A 2003-318396 (Kokai)).

Not only can photolithography steps be reduced using such a structure, but the base contact layer can be formed at a deeper position. Therefore, the avalanche withstand capability can be increased. Further, the base layer, which has a resistivity higher than that of the base contact layer, can be made narrow, and therefore the ON resistance can be reduced.

However, in such a structure, metal forming the source electrode may not be able to fill the base trench, resulting in voids. Such voids increase the contact resistance between the base contact layer and the source electrode, causing an avalanche current to flow in the base layer. A potential difference thereby occurs due to resistance in the base layer, and a parasitic bipolar transistor readily occurs. In the case where the parasitic bipolar transistor occurs, the avalanche current undesirably concentrates in one location, and the avalanche withstand capability decreases.

Particularly in a product having a low breakdown voltage, the proportion of the channel resistance due to the ON resistance is large, and it is necessary to increase the channel density and reduce the cell pitch to reduce the ON resistance. However, to reduce the cell pitch, it is necessary to reduce the width of the base trench; and it becomes even more difficult to fill the source electrode into the base trench.

On the other hand, forming the base trench shallower to improve the ease of filling the metal makes the base contact layer distal to the point at which avalanche breakdown occurs, and still the avalanche withstand capability decreases.

SUMMARY OF THE INVENTION

According to an aspect of the invention, there is provided a power semiconductor device, including: a semiconductor substrate of a first conductivity type; a drift layer of the first conductivity type formed on the semiconductor substrate and having an impurity concentration lower than an impurity concentration of the semiconductor substrate; a base layer of a second conductivity type formed on the drift layer; a source layer of the first conductivity type formed on a portion of the base layer; a plurality of trench gate electrodes extending through the source layer and the base layer to enter into an interior of the drift layer; a gate insulation film provided between the trench gate electrode and the drift layer, the base layer, and the source layer; a base contact layer of the second conductivity type formed in a region of an upper layer portion of the base layer between the trench gate electrodes and having an impurity concentration higher than an impurity concentration of the base layer; a source electrode connected to the source layer and the base contact layer; and a drain electrode connected to the semiconductor substrate, an impurity concentration profile of the base contact layer along a direction perpendicular to an upper face of the semiconductor substrate being highest at an upper face of the base contact layer, having a local minimum value at a position other than the upper face and a lower face of the base contact layer, and having a local maximum value at a position lower than the position of the local minimum value.

According to another aspect of the invention, there is provided a power semiconductor device, including: a semiconductor substrate of a first conductivity type; a drift layer of the first conductivity type formed on the semiconductor substrate and having an impurity concentration lower than an impurity concentration of the semiconductor substrate; a base layer of a second conductivity type formed on the drift layer; a source layer of the first conductivity type formed on a portion of the base layer; a plurality of trench gate electrodes having a striped configuration that extends in one direction parallel to an upper face of the semiconductor substrate, and extending through the source layer and the base layer to enter into an interior of the drift layer; a gate insulation film provided between the trench gate electrode and the drift layer, the base layer, and the source layer; a base contact layer of the second conductivity type formed in a region of an upper layer portion of the base layer between the trench gate electrodes, having a striped configuration extending in the one direction, a lower face positioned lower than a lower face of the source layer, and an impurity concentration higher than an impurity concentration of the base layer; a source electrode connected to the source layer and the base contact layer; and a drain electrode connected to the semiconductor substrate, the source layer and the base layer being disposed between the trench gate electrode and the base contact layer, and an impurity concentration profile of the base contact layer along a direction perpendicular to the upper face of the semiconductor substrate being highest at an upper face of the base contact layer, having a local minimum value at a position other than the upper face and a lower face of the base contact layer, and having a local maximum value at a position lower than the position of the local minimum value.

According to another aspect of the invention, there is provided a power semiconductor device, including: a semiconductor substrate of a first conductivity type; a drift layer of the first conductivity type formed on the semiconductor substrate and having an impurity concentration lower than an impurity concentration of the semiconductor substrate; a base layer of a second conductivity type formed on the drift layer; a source layer of the first conductivity type formed on a portion of the base layer; a plurality of trench gate electrodes having a striped configuration that extends in one direction parallel to an upper face of the semiconductor substrate, and extending through the source layer and the base layer to enter into an interior of the drift layer; a gate insulation film provided between the trench gate electrode and the drift layer, the base layer, and the source layer; a base contact layer of the second conductivity type formed in a region of an upper layer portion of the base layer between the trench gate electrodes, having a striped configuration extending in the one direction, a lower face positioned lower than a lower face of the source layer, and an impurity concentration higher than an impurity concentration of the base layer; a source electrode connected to the source layer and the base contact layer; and a drain electrode connected to the semiconductor substrate, the source layer and the base layer being disposed between the trench gate electrode and the base contact layer, an upper face of the base contact layer being positioned lower than an upper face of the source layer to define a base trench, a portion of the source electrode being filled into the base trench, and an impurity concentration profile of the base contact layer along a direction perpendicular to the upper face of the semiconductor substrate being highest at the upper face of the base contact layer, having a local minimum value at a position other than the upper face and a lower face of the base contact layer, and having a local maximum value at a position lower than the position of the local minimum value.

DETAILED DESCRIPTION OF THE INVENTION

Embodiments of the present invention will now be described with reference to the drawings.

First, a first embodiment of the present invention will be described.

Figure 1A:
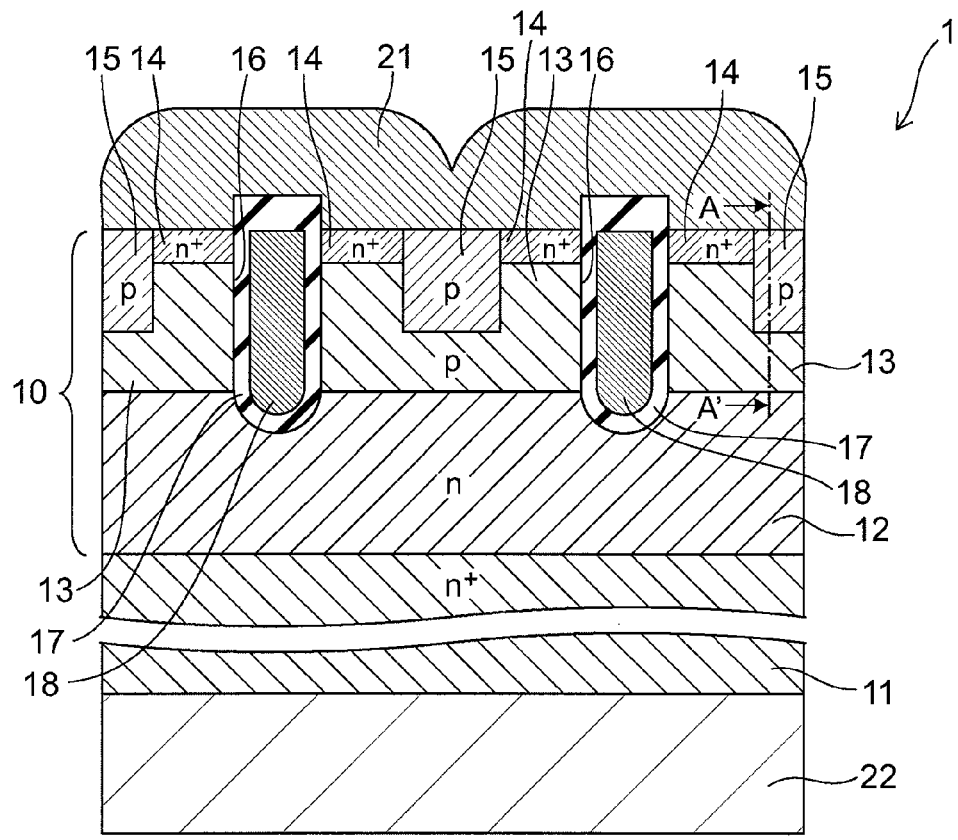
FIG. 1 is a cross-sectional view illustrating a power semiconductor device according to a first embodiment of the invention.
FIG. 1B is a graph illustrating an impurity concentration profile of a p type base contact layer.
Figure 1B:
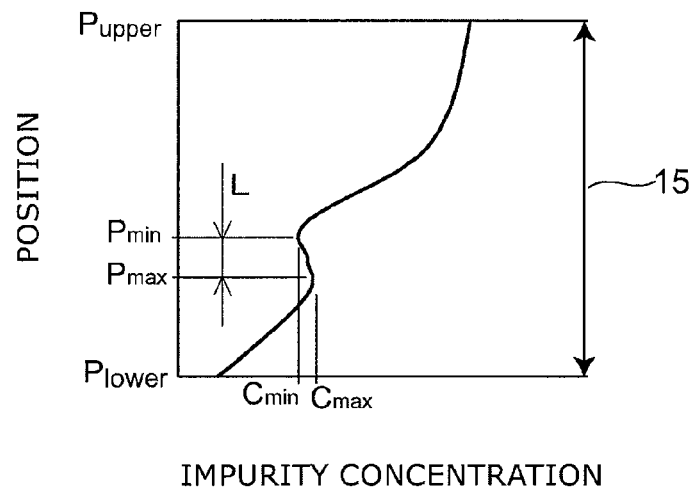

FIG. 1A is a cross-sectional view illustrating a power semiconductor device according to this embodiment. FIG. 1B is a graph illustrating an impurity concentration profile of a p type base contact layer, where a position in the p type base contact layer in a vertical direction is plotted on the vertical axis, and the impurity concentration is plotted on the horizontal axis.

The positions plotted on the vertical axis of FIG. 1B correspond to positions of the p type base contact layer along line A-A' of FIG. 1A.

As illustrated in FIG. 1A, a power semiconductor device 1 according to this embodiment is a vertical UMOS power device. An n$^+$ type substrate 11 (a semiconductor substrate) is provided in the power semiconductor device 1. The n$^+$ type substrate 11 is made of semiconductor material, for example silicon, having n$^+$ type conductivity. An n type drift layer 12 having n type conductivity is formed on the n$^+$ type substrate 11. For example, the n type drift layer 12 is formed by epitaxially growing semiconductor material, for example, silicon doped with phosphorus on the n$^+$ type substrate 11. The impurity concentration of the n type drift layer 12 is lower than the impurity concentration of the n$^+$ type substrate 11. In the present specification, "impurity concentration" refers to the effective impurity concentration contributing to the conductivity of the semiconductor material, i.e., the base material.

A p type base layer 13 having p type conductivity is formed on the n type drift layer 12. An n$^+$ type source layer 14 having the n$^+$ type conductivity is formed on a portion of the p type base layer 13. A p type base contact layer 15, having the p type conductivity and an impurity concentration higher than the impurity concentration of the p type base layer 13, is formed on another portion of the p type base layer 13. The p type base contact layer 15 has a striped configuration extending in one direction parallel to an upper face of the n$^+$ type substrate 11. An upper face of the p type base contact layer 15 is disposed at substantially the same height as the upper face of the n$^+$ type source layer 14. The upper face of the n$^+$ type source layer 14 and the upper face of the p type base contact layer 15 thereby form a flat surface. A semiconductor portion 10 of the power semiconductor device 1 is formed of the n$^+$ type substrate 11, the n type drift layer 12, the p type base layer 13, the n$^+$ type source layer 14, and the p type base contact layer 15. The semiconductor portion 10 is formed by, for example, epitaxially growing a silicon layer on the n$^+$ type substrate 11 and locally implanting donors or acceptors.

A plurality of gate trenches 16 are formed in a grooved configuration in an upper face of the semiconductor portion 10. A gate insulation film 17 is formed on an inner face of each gate trench 16. A conductive material such as poly silicon, a metal, etc., is filled into an interior of the gate trench 16 to form a trench gate electrode 18. In other words, the gate insulation film 17 is provided between the trench gate electrode 18 and the n type drift layer 12, the p type base layer 13, and the n$^+$ type source layer 14 to insulate the trench gate electrode 18 from the n type drift layer 12, the p type base layer 13, and the n$^+$ type source layer 14.

The gate trench 16 passes completely through the n$^+$ type source layer 14 and the p type base layer 13 to reach an upper layer portion of the n type drift layer 12. Accordingly, the trench gate electrode 18 also extends through the n$^+$ type source layer 14 and the p type base layer 13 to enter into the interior of the upper layer portion of the n type drift layer 12. The trench gate electrode 18 has a striped configuration extending in the same direction as the p type base contact layer 15. The trench gate electrode 18 and the p type base contact layer 15 are mutually distal; and the p type base layer 13 and the n$^+$ type source layer 14 are disposed therebetween.

The p type base contact layer 15 is formed in a region of the p type base layer 13 between the gate trenches 16 and has a depth which is deeper than that of the n$^+$ type source layer 14 and shallower than those of the gate trench 16 and the p type base layer 13. In other words, a lower face of the p type base contact layer 15 is positioned lower than a lower face of the n$^+$ type source layer 14 and higher than a lower face of the p type base layer 13. Accordingly, the p type base contact layer 15 extends through the n$^+$ type source layer 14 to enter into the p type base layer 13; and the p type base layer 13 is disposed between the p type base contact layer 15 and the n type drift layer 12. Although only two trench gate electrodes 18 are illustrated in FIG. 1A, actually, numerous trench gate electrodes 18 are formed in regions not illustrated; and p type base contact layers 15 are formed therebetween.

A source electrode 21 made of, for example, metal, is provided above the semiconductor portion 10. The source electrode 21 covers the gate trench 16 and connects to the $n^+$ type source layer 14 and the p type base contact layer 15 by contacting the upper faces of these two layers. On the other hand, a drain electrode 22 made of, for example, metal, is provided below the semiconductor portion 10. The drain electrode 22 is connected to the $n^+$ type substrate 11 by contacting a lower face of the $n^+$ type substrate 11.

As illustrated in FIG. 1B, the impurity concentration profile in the vertical direction of the p type base contact layer 15 of the power semiconductor device 1 according to this embodiment has a two-stage configuration. That is, the impurity concentration profile is the highest at the upper face of the p type base contact layer 15; has a local minimum value $C_{min}$ at a position $P_{min}$ other than the upper face and the lower face; and has a local maximum value $C_{max}$ at a position $P_{max}$ lower than the position $P_{min}$. "Vertical direction" refers to a direction perpendicular to the upper face of the $n^+$ type substrate 11.

A ratio ($L/C_{min}$) is used as an index X to indicate a resistance value of the p type base contact layer 15, where L is a distance between the position $P_{min}$ of the local minimum value $C_{min}$ and the position $P_{max}$ of the local maximum value $C_{max}$. Restated, $X=L/C_{min}$. X is not more than $6\times10^{-16}$ cm$^4$ when the units of the local minimum value $C_{min}$ are cm$^{-3}$ and the units of the distance L are cm.

On the other hand, an impurity concentration profile in the vertical direction of a portion of the p type base layer 13 corresponding to a region directly below the p type base contact layer 15 continues from the impurity concentration profile of the p type base contact layer 15 described above. In the impurity concentration profile of the p type base layer 13, the impurity concentration decreases along the downward direction.

Figure 2:
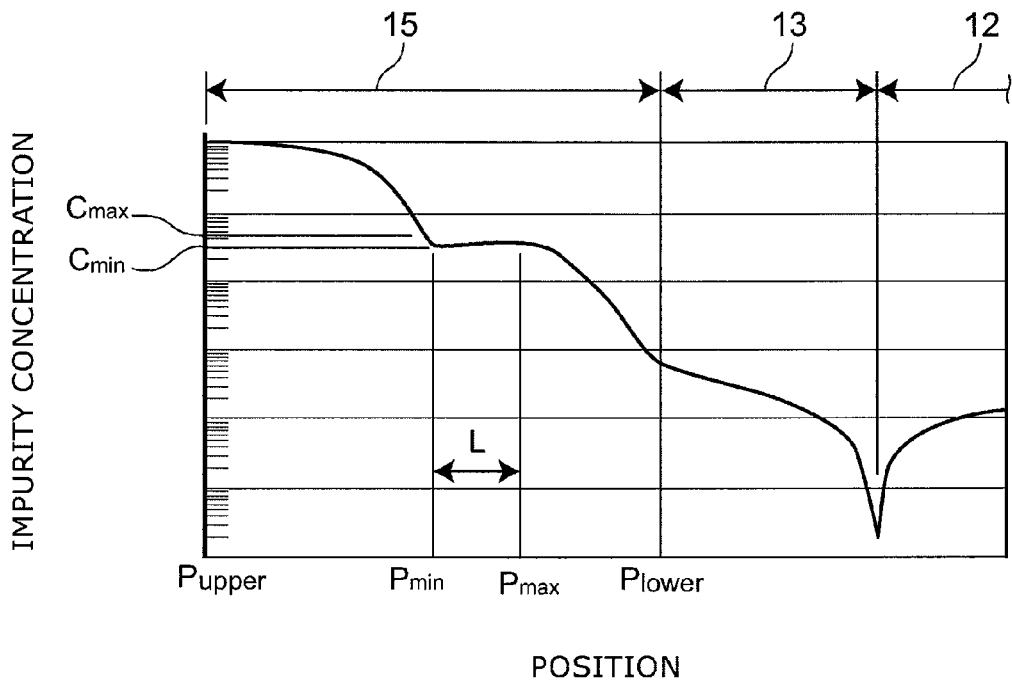
FIG. 2 is a graph illustrating a specific example of an impurity concentration profile of the first embodiment.

FIG. 2 is a graph illustrating a specific example of an impurity concentration profile of this embodiment, in which the position along line A-A' of FIG. 1A is plotted on the horizontal axis and the impurity concentration is plotted on the vertical axis.

In the example illustrated in FIG. 2, the semiconductor material forming the base material of the p type base layer 13 and the p type base contact layer 15 is silicon (Si), and the impurity is boron (B). For the n type drift layer 12, the semiconductor material forming the base material is silicon, and the impurity is phosphorus (P).

As illustrated in FIG. 2, the boron concentration profile along line A-A' is continuous between the p type base contact layer 15 and the p type base layer 13; and the boron concentration of the p type base contact layer 15 is higher than the boron concentration of the p type base layer 13. The boron concentration in the p type base contact layer 15 is highest at an upper face $P_{upper}$ of the p type base contact layer 15, lowest at a lower face $P_{lower}$ of the p type base contact layer 15, has the local minimum value $C_{min}$ at the position $P_{min}$ between the upper face $P_{upper}$ and the lower face $P_{lower}$, and has the local maximum value $C_{max}$ at the position $P_{max}$ which is lower than the position $P_{min}$. On the other hand, the boron concentration in the p type base layer 13 monotonously decreases along the downward direction. Such a boron concentration profile can be realized by, for example, a plurality of times, e.g., two times, of ion implantations when forming the p type base contact layer 15.

Operations of the power semiconductor device according to this embodiment will now be described.

In this embodiment, a MOSFET is formed including a gate electrode formed by the trench gate electrode 18 provided between the source electrode 21 and the drain electrode 22, and a channel region formed in a region of the p type base layer 13 that contacts the gate insulation film 17. By providing an impurity concentration profile of the p type base contact layer 15 having a configuration as described above, at least a certain level of the impurity concentration of the uppermost layer portion can be provided, and at least a certain level of the impurity concentration of the lower portion also can be provided while reducing the impurity amount of the entire p type base contact layer 15.

Reducing the impurity amount of the entire p type base contact layer 15 can prevent the impurities of the p type base contact layer 15 from diffusing and undesirably increasing the size of the p type base contact layer 15. Thereby, the power semiconductor device 1 can be miniaturized; the channel density can be increased; and the ON resistance can be reduced.

Also, increasing the impurity concentration of the uppermost layer portion of the p type base contact layer 15 can reduce the contact resistance to the source electrode 21.

Further, by increasing the impurity concentration of the lower portion of the p type base contact layer 15, the resistance of the lower portion decreases; and in the case where avalanche breakdown occurs in the interface between the n type drift layer 12 and the p type base layer 13, holes of the resulting electron-hole pairs can easily pass through the p type base contact layer 15 to the source electrode 21. As a result, high avalanche withstand capability can be obtained.

By thus providing a p type base contact layer 15 having high avalanche withstand capability, a depletion layer occurring from the junction interface between the p type base layer 13 and the n type drift layer 12 essentially does not spread into the p type base contact layer 15. Accordingly, it is favorable for the impurity concentration of the lowermost portion of the p type base contact layer 15 to be a concentration such that the depletion layer essentially does not spread into the p type base contact layer 15.

Moreover, in this embodiment, the trench gate electrode 18 and the p type base contact layer 15 are provided in striped configurations mutually parallel and mutually distal; and the $n^+$ type source layer 14 and the p type base layer 13 are disposed between the trench gate electrode 18 and the p type base contact layer 15. Thereby, both side faces of the gate insulation film 17 contact the entire length of the p type base layer 13 in the longitudinal direction of the trench gate electrode 18; and the channel region is formed in the contacting portion. Therefore, the width of the channel region of the power semiconductor device 1 is large, and the ON resistance is low.

Further, by positioning the lower face of the p type base contact layer 15 lower than the lower face of the $n^+$ type source layer 14, holes created at the interface between the n type drift layer 12 and the p type base layer 13 can reach the p type base contact layer 15 more easily. Thereby, the holes can be efficiently released, and the avalanche withstand capability increases.

However, in the case where the impurity amount of the p type base contact layer 15 of such a configuration is too high, a portion of the p type base contact layer 15 positioned in the p type base layer 13 expands undesirably to increase the threshold voltage for inverting the channel region. To describe in greater detail, in the case where the impurity amount of the portion of the p type base contact layer 15 positioned lower than the lower face of the n+ type source layer 14 is too high, the impurities of this portion diffuse due to heat treatment and the like after implantation and undesirably reach the region of the p type base layer 13 contacting the gate insulation film 17, that is, the channel region of the MOSFET. Thereby, the threshold voltage of the MOSFET, that is, the electrical potential of the trench gate electrode 18 necessary for inverting the channel region, undesirably increases. Particularly in a structure such as that of this embodiment in which the trench gate electrode 18 and the p type base contact layer 15 extend mutually in parallel and faced each other across a small spacing of the thin striped n+ type source layer 14, impurities diffusing from the p type base contact layer 15 easily reach the entire width-direction portion of the channel region. Therefore, the threshold voltage particularly increases.

Therefore, in this embodiment, the impurity concentration profile of the p type base contact layer 15 in the vertical direction has a maximum value at the upper face and a peak lower than the maximum value at an intermediate position. Thereby, the contact resistance between the p type base contact layer 15 and the source electrode 21 can be reduced; the impurity amount of the entire p type base contact layer 15 can be reduced; and the impurities of the p type base contact layer 15 can be inhibited from reaching the channel region by diffusion while reducing the resistance of the lower portion of the p type base contact layer 15. Therefore, the increase of the threshold voltage can be prevented. These effects are particularly large in a structure in which the trench gate electrode 18 and the p type base contact layer 15 extend in the same direction to face each other over a small spacing such as in this embodiment because the impurities do not readily reach the entire width-direction channel region.

Further, in this embodiment, sufficiently high avalanche withstand capability can be obtained as described above. Therefore, it is not necessary to form a base trench in the semiconductor portion 10 in a region directly above the p type base contact layer 15. As a result, problems do not arise due to voids occurring when filling the source electrode 21 into the base trench; and the avalanche withstand capability is not reduced by the occurrence of voids. Also, it is not necessary to increase the width of the base trench to avoid the occurrence of voids; and the miniaturization of the device is not obstructed thereby. Thus, according to this embodiment, a power semiconductor device can be realized having a low ON resistance and high avalanche withstand capability.

Furthermore, in this embodiment, the index X of the resistance value is not more than $6 \times 10^{-16}$ cm$^4$. Thereby, the resistance value of the p type base contact layer 15 can be reduced, and the avalanche withstand capability of the device 1 can be increased even more. Reasons therefore are described below.

Figure 3:
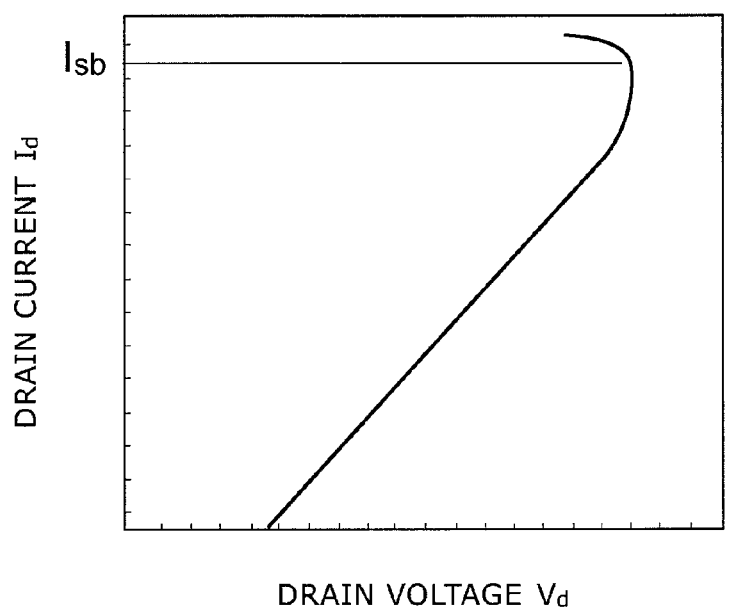
FIG. 3 is a graph illustrating operating characteristics of the power semiconductor device.

FIG. 3 is a graph illustrating operating characteristics of the power semiconductor device, in which a drain voltage $V_d$ applied between the source and drain is plotted on the horizontal axis, and a drain current $I_d$ flowing between the source and drain is plotted on the vertical axis.

As illustrated in FIG. 3, the drain current $I_d$ begins to flow when the drain voltage $V_d$ of the power semiconductor device according to this embodiment reaches a certain value. The drain current $I_d$ then increases as the drain voltage $V_d$ increases. When the drain voltage $V_d$ reaches a certain value, snap-back occurs due to the npn transistor of the MOSFET switching ON, and the drain voltage $V_d$ abruptly decreases. The drain current $I_d$ at this point is referred to as a snap-back current $I_{sb}$. The avalanche withstand capability of the device 1 increases as the snap-back current $I_{sb}$ increases.

Figure 4:
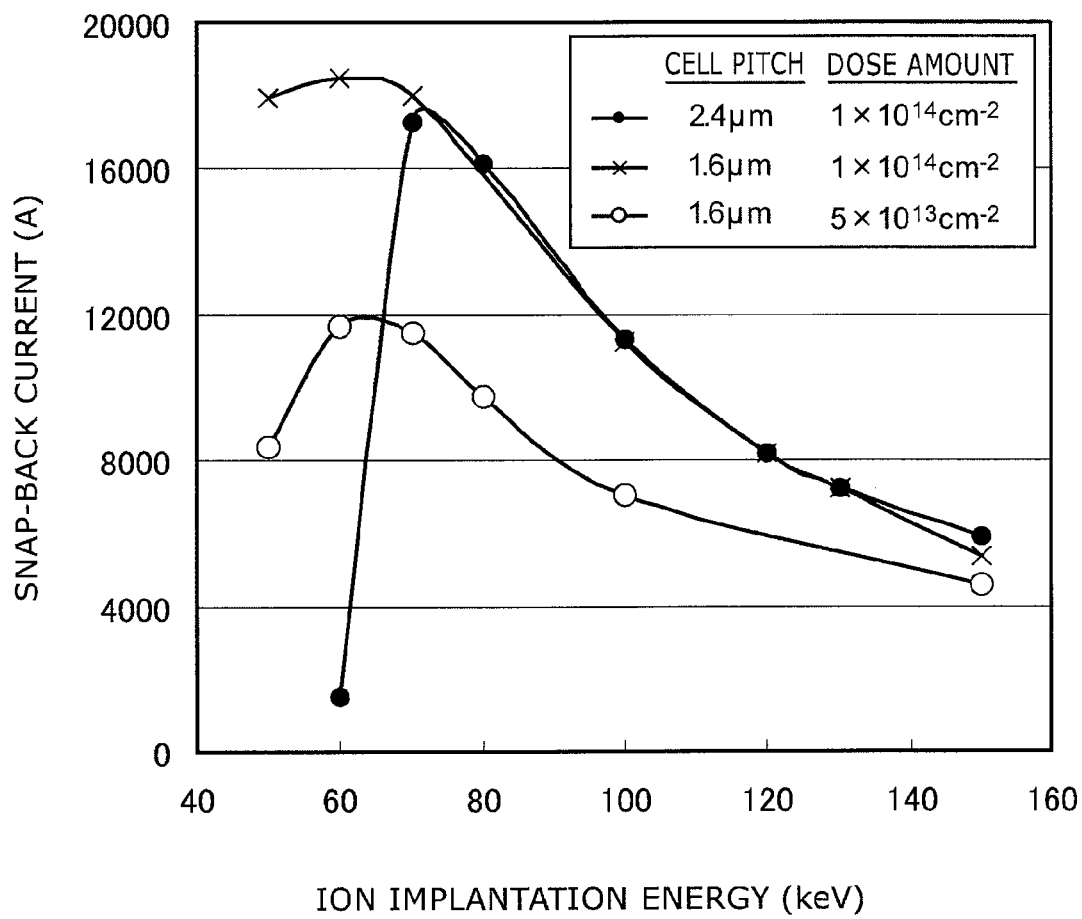
FIG. 4 is a graph illustrating effects of the depth of the ion implantation on the avalanche withstand capability of the device.

FIG. 4 is a graph illustrating effects of the depth of the ion implantation on the avalanche withstand capability of the device, in which the ion implantation energy is plotted on the horizontal axis, and the snap-back current is plotted on the vertical axis.

The ion implantation energy plotted on the horizontal axis of FIG. 4 illustrates the highest ion implantation energy of the multiple ion implantations for forming the p type base contact layer 15. In other words, the implantation for forming the lowermost portion of the p type base contact layer 15 is illustrated.

Figure 5:
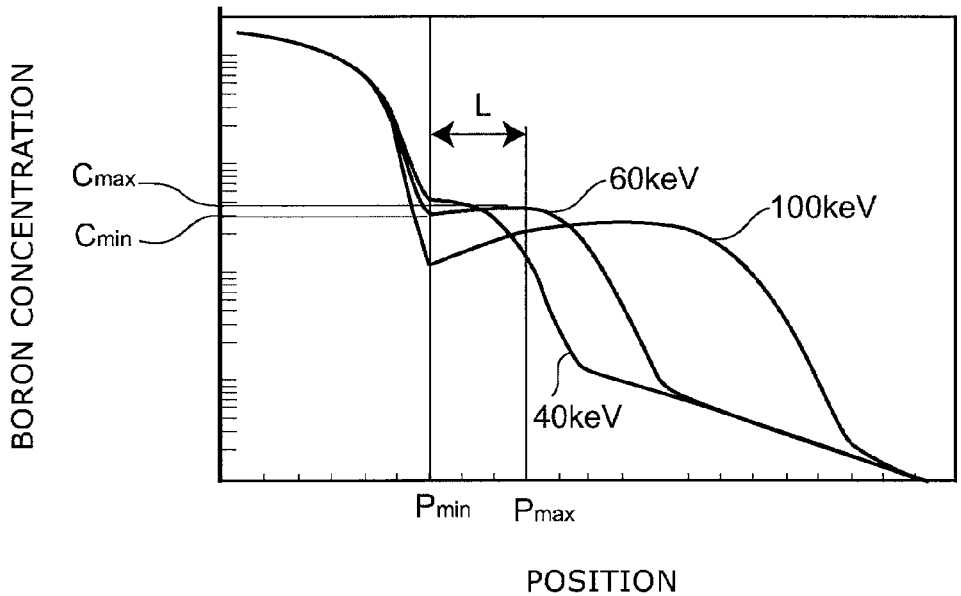
FIG. 5 is a graph illustrating effects of the ion implantation energy of the implantation for forming the lower portion of the p type base contact layer on the boron concentration profile.

FIG. 5 is a graph illustrating effects of the ion implantation energy of the implantation for forming the lower portion of the p type base contact layer on the boron concentration profile, in which the position in the p type base contact layer in the vertical direction is plotted on the horizontal axis, and the boron concentration is plotted on the vertical axis.

The profiles of FIG. 5 also illustrate the boron implanted by the implantation for forming the upper portion of the p type base contact layer 15. FIG. 4 and FIG. 5 are results of simulations.

The dependency of the snap-back current on the ion implantation energy is illustrated in FIG. 4. One peak exists; and the snap-back current has a maximum when the ion implantation energy reaches a certain value, e.g., about 60 keV or about 70 keV in the example of FIG. 4, and decreases as the ion implantation energy increases or decreases therefrom. Such behavior is considered to be caused by the following reasons.

As illustrated in FIG. 5, the peak of the boron concentration profile is lower as the ion implantation energy increases. The position $P_{max}$, the position $P_{min}$, the local maximum value $C_{max}$, and the local minimum value $C_{min}$ illustrated in FIG. 5 are values for ion implantation energy of 60 keV.

In the case where the ion implantation energy for forming the lower portion of the p type base contact layer 15 is low, e.g., 40 keV in the example illustrated in FIG. 5, the position $P_{max}$ at which the boron concentration has a local maximum value is positioned too high, and the boron concentration of the lower portion of the p type base contact layer 15 decreases. Thereby, the breakdown point at which avalanche breakdown occurs is in a region directly below the trench gate electrode 18 rather than in the region directly below the p type base contact layer 15; and holes created due to the breakdown cannot efficiently pass through to the source electrode 21. As a result, the snap-back current decreases, and the avalanche withstand capability decreases.

In the case where the ion implantation energy is increased, e.g., 60 keV in the example illustrated in FIG. 5, the position $P_{max}$ is lower, and the boron concentration of the lower portion of the p type base contact layer 15 increases. Thereby, the breakdown point is in the region directly below the p type base contact layer 15, and the holes created due to the breakdown can efficiently pass through the p type base contact layer 15 to the source electrode 21. The snap-back current thereby increases, and the avalanche withstand capability increases.

However, in the case where the ion implantation energy is increased further, e.g., 100 keV in the example illustrated in FIG. 5, the position $P_{max}$ at which the boron concentration profile has the local maximum value $C_{max}$ is positioned too low. As a result, a high-resistance layer undesirably occurs proximal to the position $P_{min}$ in the p type base contact layer 15, and the snap-back current still decreases.

The resistance value of the high-resistance layer in the p type base contact layer 15 is determined by the depth and the width of the trough formed proximal to the position $P_{min}$ of the profile illustrated in FIG. 5. The lower the local minimum value $C_{min}$ of the impurity concentration, the deeper the trough and the higher the resistance value. Also, the larger the distance L between the position $P_{min}$ and the position $P_{max}$, the wider the trough and the higher the resistance value. Accordingly, the value of the distance L divided by the local minimum value $C_{min}$ ($L/C_{min}$) can be used as the index X to indicate the resistance value of the p type base contact layer 15.

Figure 6:
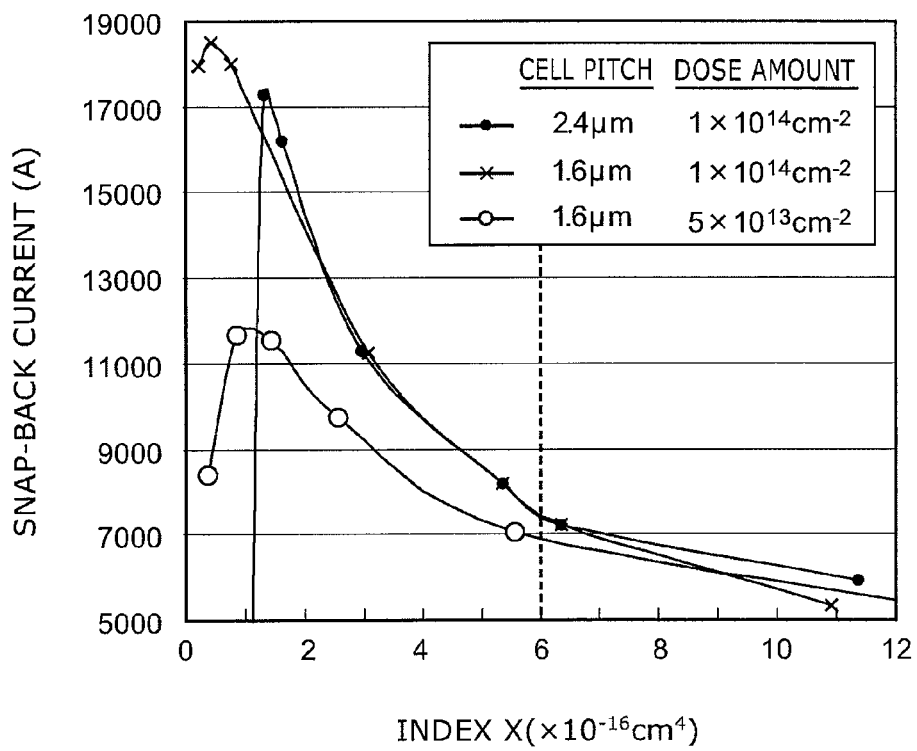
FIG. 6 is a graph illustrating the effects of the index X on the avalanche withstand capability of the device.

FIG. 6 is a graph illustrating the effects of the index X on the avalanche withstand capability of the device, in which the index X is plotted on the horizontal axis and the snap-back current is plotted on the vertical axis.

The data illustrated in FIG. 6 is the result of simulations using different cell pitches of the device 1 and different dose amounts of the implantation for forming the lowermost portion of the p type base contact layer 15. In other words, FIG. 6 illustrates data for cases in which the cell pitch is 1.6 μm and the dose amount is $1\times10^{14}$ cm$^{-2}$; the cell pitch is 2.4 μm and the dose amount is $1\times10^{14}$ cm$^{-2}$; and the cell pitch is 1.6 μm and the dose amount is $5\times10^{13}$ cm$^{-2}$. For all of the conditions illustrated in FIG. 6, the snap-back current abruptly increases when the index X is $6\times10^{-16}$ cm$^4$ or less. Accordingly, it is favorable that the index X is not more than $6\times10^{-16}$ cm$^4$.

A second embodiment of the present invention will now be described.

Figure 7A:
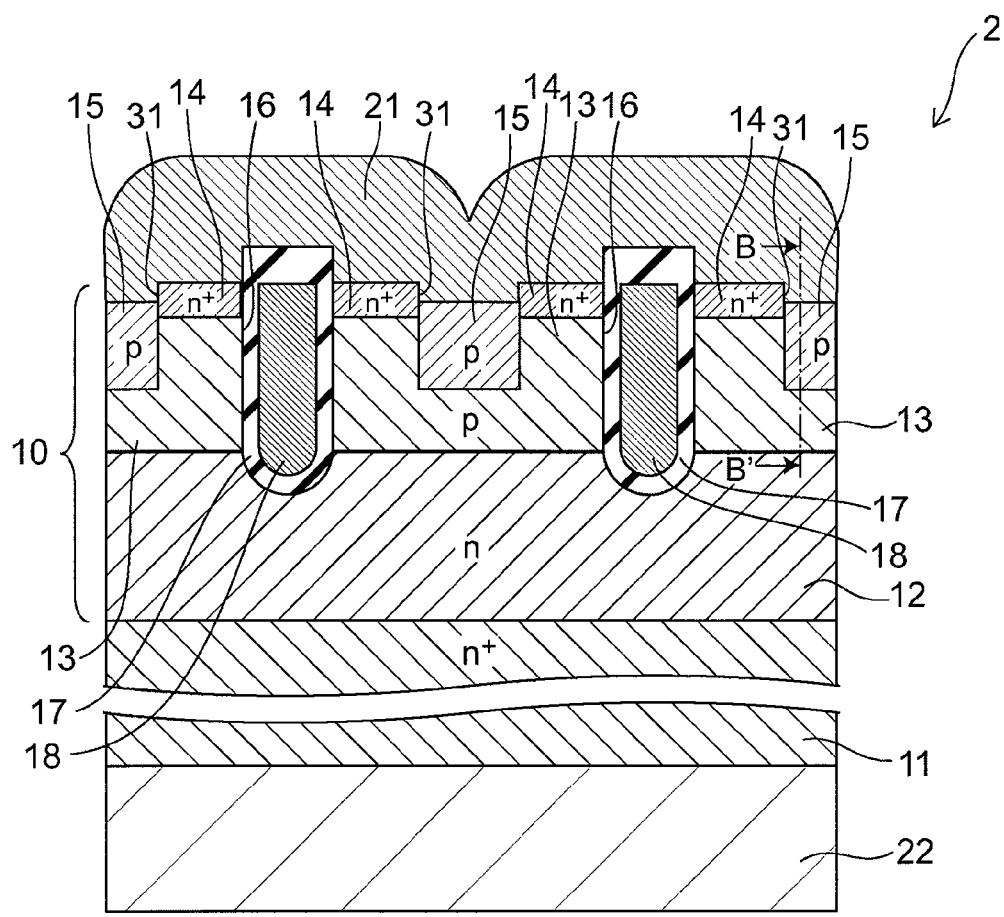
FIG. 7A is a cross-sectional view illustrating a power semiconductor device according to a second embodiment of the invention.
Figure 7B:
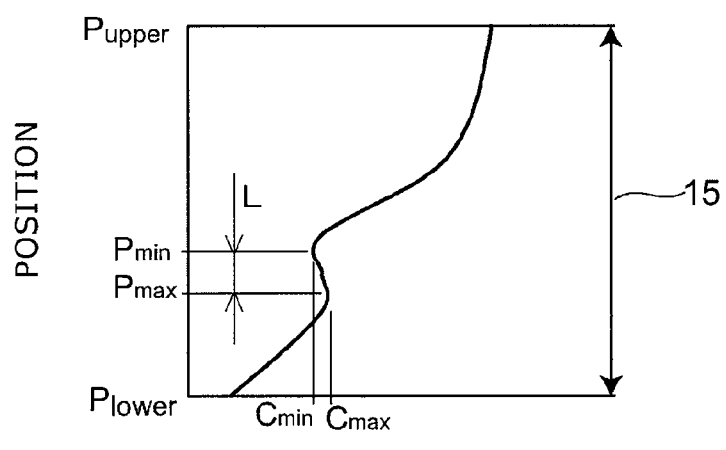
FIG. 7B is a graph illustrating the impurity concentration profile of the p type base contact layer.

FIG. 7A is a cross-sectional view illustrating a power semiconductor device according to this embodiment. FIG. 7B is a graph illustrating the impurity concentration profile of the p type base contact layer, in which the position in the p type base contact layer in the vertical direction is plotted on the vertical axis, and the impurity concentration is plotted on the horizontal axis. The positions plotted on the vertical axis of FIG. 7B correspond to positions of the p type base contact layer along line B-B' of FIG. 7A.

As illustrated in FIGS. 7A and 7B, the upper face of the p type base contact layer 15 of a power semiconductor device 2 according to this embodiment is positioned lower than the upper face of the n$^+$ type source layer 14. A base trench 31 is thereby defined in the semiconductor portion 10 in a grooved configuration in a region directly above the p type base contact layer 15. A portion of the source electrode 21 is filled into the base trench 31.

According to this embodiment, the base trench 31 is defined in the region directly above the p type base contact layer 15. Thereby, the position of the p type base contact layer 15 is shifted downward in comparison to that of the first embodiment described above. As a result, the avalanche breakdown can be more reliably caused to occur in the region directly below the p type base contact layer 15; the holes created due to the breakdown can be efficiently released to the source electrode 21; and the avalanche withstand capability can be increased even more.

The impurity concentration profile of the p type base contact layer 15 of this embodiment also has a two-stage configuration similar to that of the first embodiment described above. Therefore, favorable avalanche withstand capability can be obtained without making the base trench 31 very deep. Both a low ON resistance and high avalanche withstand capability can be realized thereby, even in the case where the base trench 31 is made.

Otherwise, the configuration, operations, and effects of this embodiment are similar to those of the first embodiment described above.

A comparative example of this embodiment will now be described.

Figure 8A:
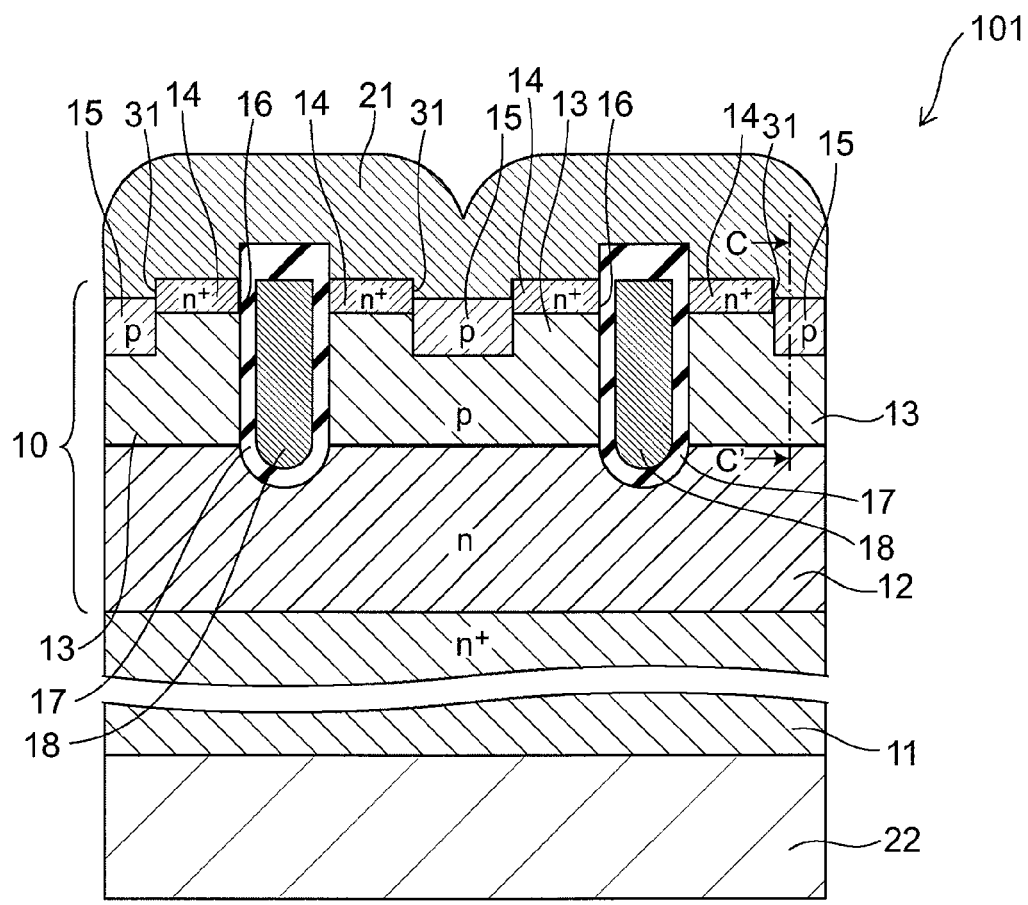
FIG. 8A is a cross-sectional view illustrating a power semiconductor device according to a comparative example.
Figure 8B:
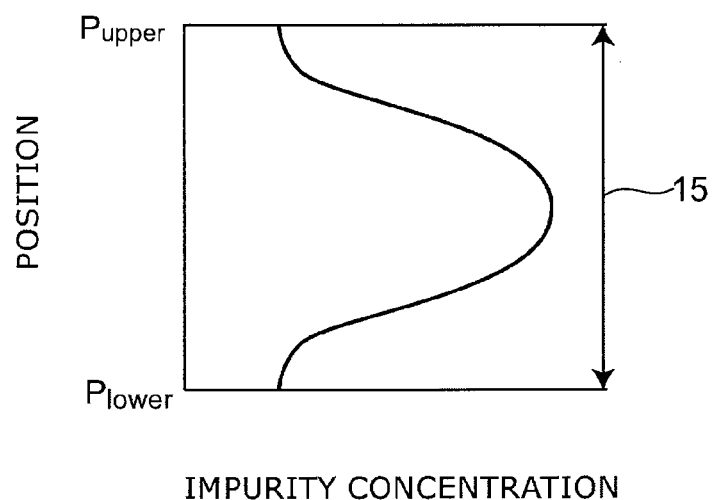
FIG. 8B is a graph illustrating an impurity concentration profile of the p type base contact layer.

FIG. 8A is a cross-sectional view illustrating a power semiconductor device according to this comparative example. FIG. 8B is a graph illustrating an impurity concentration profile of the p type base contact layer, in which the position in the p type base contact layer in the vertical direction is plotted on the vertical axis, and the impurity concentration is plotted on the horizontal axis. The positions plotted on the vertical axis of FIG. 8B correspond to positions of the p type base contact layer along line C-C' of FIG. 8A.

As illustrated in FIGS. 8A and 8B, the impurity concentration profile of the p type base contact layer 15 in the vertical direction in a power semiconductor device 101 according to this comparative example has only one peak. In other words, the impurity concentration of the p type base contact layer 15 is relatively low at the upper face and the lower face, and relatively high at a central portion. Otherwise, the configuration of this comparative example is similar to that of the second embodiment described above.

Figure 9:
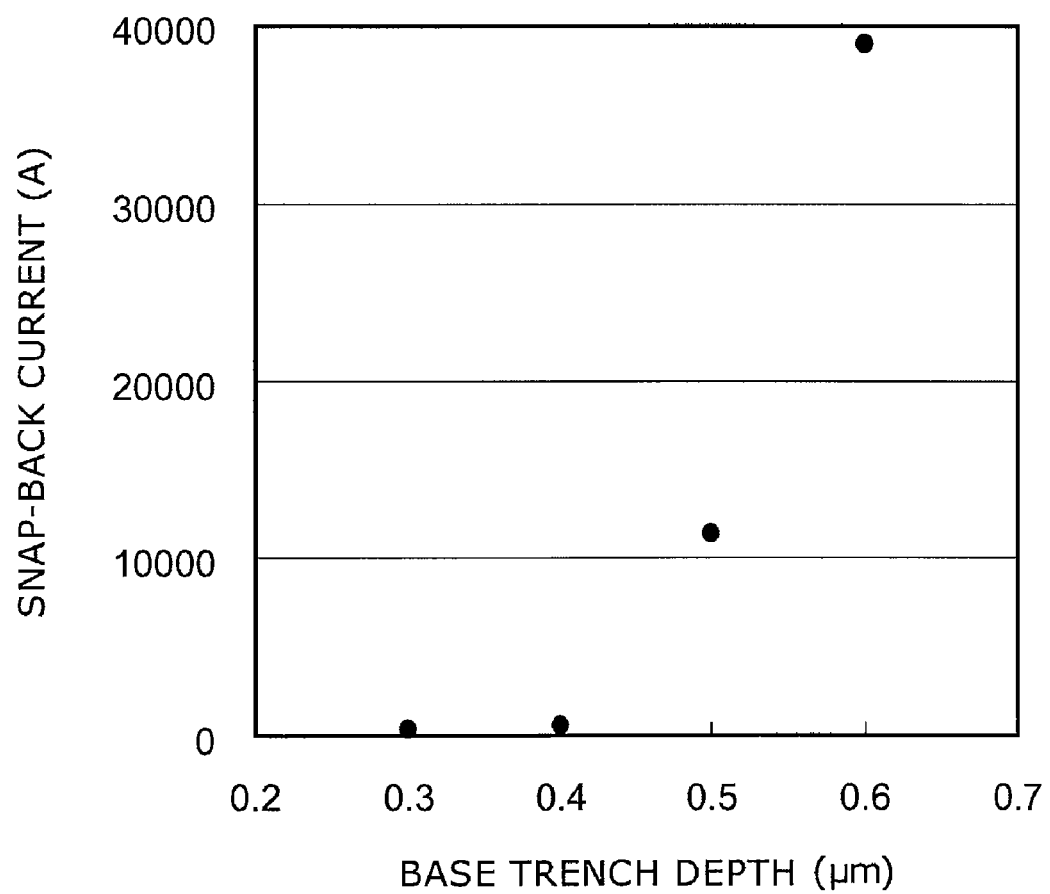
FIG. 9 is a graph illustrating effects of the depth h of the base trench on the avalanche withstand capability of the device of the power semiconductor device according to the comparative example.

FIG. 9 is a graph illustrating effects of the depth of the base trench of the power semiconductor device according to this comparative example on the avalanche withstand capability of the device, in which the depth of the base trench is plotted on the horizontal axis, and the snap-back current is plotted on the vertical axis.

As illustrated in FIG. 9, the avalanche withstand capability is low in the power semiconductor device 101 in the case where the depth of the base trench 31 is shallow. For example, in the example illustrated in FIG. 9, the snap-back current is exceedingly small when the depth h of the base trench 31 is 0.4 μm or less. Such results are considered to be caused by the following reasons.

Namely, the impurity concentration profile of the p type base contact layer 15 in the vertical direction of this comparative example has only one peak. Therefore, the impurity concentration of the uppermost layer portion and the lower portion of the p type base contact layer 15 are relatively low. Therefore, the contact resistance to the source electrode 21 increases, and the resistance of the lower portion also increases. Thereby, avalanche breakdown undesirably occurs in the region directly below the trench gate electrode 18 rather than the region directly below the p type base contact layer 15; and the hole current created by the breakdown passes through the p type base layer 13 and the n$^+$ type source layer 14 to the source electrode 21. As a result, a potential difference occurs in the current direction due to resistance in the p type base layer 13; and the npn transistor formed of the n$^+$ type substrate 11, the n type drift layer 12, the p type base layer 13, and the n$^+$ type source layer 14 can be easily switched ON. When the npn transistor switches ON, the avalanche current undesirably concentrates in one location, and the breakdown withstand capability undesirably decreases.

Although the avalanche withstand capability can be increased by increasing the depth h of the base trench 31 as illustrated in FIG. 9, doing so makes it difficult to fill the source electrode 21 into the base trench 31. Therefore, it is then necessary to increase the width of the base trench 31; the channel density decreases; and the ON resistance undesirably decreases.

Although it may be considered to increase the impurity amount of the entire p type base contact layer 15 to increase the avalanche withstand capability while keeping the depth h shallow, doing so undesirably increases the width of the p type base contact layer 15; and miniaturization of the device becomes difficult. As a result, the channel density still decreases, and the ON resistance undesirably decreases.

Thus, the balance of the ON resistance and the avalanche withstand capability is poor for the power semiconductor device 101 according to this comparative example in comparison to those of the power semiconductor devices according to the first and second embodiments.

Hereinabove, the present invention is described with reference to the embodiments. However, the present invention is not limited to these embodiments. For example, all additions, deletions, or design modifications of components or additions, omissions, or condition modifications of steps appropriately made by one skilled in the art in regard to the embodiments described above are within the scope of the present invention to the extent that the purport of the present invention is included. For example, although examples are illustrated in the embodiments described above in which the semiconductor material which forms the base material of each layer is silicon and the acceptor is boron, the present invention is not limited thereto. Further, a semi super-junction structure of power semiconductor devices according to the embodiments described above, in which a p type pillar layer having a striped configuration is formed in a region of the n type drift layer 12 directly below the p type base contact layer 15, also is included in the present invention.

The invention claimed is:

1. A power semiconductor device, comprising:
a semiconductor substrate of a first conductivity type;
a drift layer of the first conductivity type formed on the semiconductor substrate and having an impurity concentration lower than an impurity concentration of the semiconductor substrate;
a base layer of a second conductivity type formed on the drift layer;
a source layer of the first conductivity type formed on a portion of the base layer;
a plurality of trench gate electrodes extending through the source layer and the base layer to enter into an interior of the drift layer;
a gate insulation film provided between the trench gate electrode and the drift layer, the base layer, and the source layer;
a base contact layer of the second conductivity type formed in a region of an upper layer portion of the base layer between the trench gate electrodes and having an impurity concentration higher than an impurity concentration of the base layer;
a source electrode connected to the source layer and the base contact layer; and
a drain electrode connected to the semiconductor substrate,
an impurity concentration profile of the base contact layer along a direction perpendicular to an upper face of the semiconductor substrate being highest at an upper face of the base contact layer, having a local minimum value at a position other than the upper face and a lower face of the base contact layer, and having a local maximum value at a position lower than the position of the local minimum value.

2. The device according to claim 1, wherein
the trench gate electrode and the base contact layer have striped configurations extending in one direction parallel to the upper face of the semiconductor substrate, and
the source layer and the base layer are disposed between the trench gate electrode and the base contact layer.

3. The device according to claim 1, wherein the lower face of the base contact layer is positioned lower than a lower face of the source layer.

4. The device according to claim 1, wherein the lower face of the base contact layer is positioned higher than a lower face of the base layer.

5. The device according to claim 1, wherein the upper face of the base contact layer is at substantially the same height as an upper face of the source layer.

6. The device according to claim 1, wherein the upper face of the base contact layer is positioned lower than an upper face of the source layer to define a base trench, a portion of the source electrode being filled into the base trench.

7. The device according to claim 1, wherein the value of a ratio of $L/C_{min}$ of the impurity concentration profile is no more than $6 \times 10^{-16}$ cm$^4$, where $C_{min}$ in cm$^{-3}$ is the local minimum value and L in cm is a distance between the position of the local minimum value and the position of the local maximum value.

8. The device according to claim 1, wherein the impurity concentration of the base contact layer is a concentration such that a depletion layer occurring from a junction interface between the base layer and the drift layer essentially does not spread into the base contact layer.

9. The device according to claim 1, wherein the first conductivity type is an n type, and the second conductivity type is a p type.

10. The device according to claim 1, wherein
the semiconductor substrate is made of silicon, and
the drift layer, the base layer, the source layer, and the base contact layer are formed of a silicon layer epitaxially grown on the semiconductor substrate.

11. A power semiconductor device, comprising:
a semiconductor substrate of a first conductivity type;
a drift layer of the first conductivity type formed on the semiconductor substrate and having an impurity concentration lower than an impurity concentration of the semiconductor substrate;
a base layer of a second conductivity type formed on the drift layer;
a source layer of the first conductivity type formed on a portion of the base layer;
a plurality of trench gate electrodes having a striped configuration that extends in one direction parallel to an upper face of the semiconductor substrate, and extending through the source layer and the base layer to enter into an interior of the drift layer;
a gate insulation film provided between the trench gate electrode and the drift layer, the base layer, and the source layer;
a base contact layer of the second conductivity type formed in a region of an upper layer portion of the base layer between the trench gate electrodes, having a striped configuration extending in the one direction, a lower face positioned lower than a lower face of the source layer, and an impurity concentration higher than an impurity concentration of the base layer;
a source electrode connected to the source layer and the base contact layer; and
a drain electrode connected to the semiconductor substrate,
the source layer and the base layer being disposed between the trench gate electrode and the base contact layer, and
an impurity concentration profile of the base contact layer along a direction perpendicular to the upper face of the semiconductor substrate being highest at an upper face of the base contact layer, having a local minimum value at a position other than the upper face and a lower face of the base contact layer, and having a local maximum value at a position lower than the position of the local minimum value.

12. The device according to claim 11, wherein the lower face of the base contact layer is positioned higher than a lower face of the base layer.

13. The device according to claim 11, wherein the upper face of the base contact layer is at substantially the same height as an upper face of the source layer.

14. The device according to claim 11, wherein the upper face of the base contact layer is positioned lower than an upper face of the source layer to define a base trench, a portion of the source electrode being filled into the base trench.

15. The device according to claim 11, wherein the value of a ratio of $L/C_{min}$ of the impurity concentration profile is no more than $6 \times 10^{-16}$ cm$^4$, where $C_{min}$ in cm$^{-3}$ is the local minimum value and L in cm is a distance between the position of the local minimum value and the position of the local maximum value.

16. The device according to claim 11, wherein the impurity concentration of the base contact layer is a concentration such that a depletion layer occurring from a junction interface between the base layer and the drift layer essentially does not spread into the base contact layer.

17. The device according to claim 11, wherein the first conductivity type is an n type, and the second conductivity type is a p type.

18. The device according to claim 11, wherein
the semiconductor substrate is made of silicon, and
the drift layer, the base layer, the source layer, and the base contact layer are formed of a silicon layer epitaxially grown on the semiconductor substrate.

19. A power semiconductor device, comprising:
a semiconductor substrate of a first conductivity type;
a drift layer of the first conductivity type formed on the semiconductor substrate and having an impurity concentration lower than an impurity concentration of the semiconductor substrate;
a base layer of a second conductivity type formed on the drift layer;
a source layer of the first conductivity type formed on a portion of the base layer;
a plurality of trench gate electrodes having a striped configuration that extends in one direction parallel to an upper face of the semiconductor substrate, and extending through the source layer and the base layer to enter into an interior of the drift layer;
a gate insulation film provided between the trench gate electrode and the drift layer, the base layer, and the source layer;
a base contact layer of the second conductivity type formed in a region of an upper layer portion of the base layer between the trench gate electrodes, having a striped configuration extending in the one direction, a lower face positioned lower than a lower face of the source layer, and an impurity concentration higher than an impurity concentration of the base layer;
a source electrode connected to the source layer and the base contact layer; and
a drain electrode connected to the semiconductor substrate,
the source layer and the base layer being disposed between the trench gate electrode and the base contact layer,
an upper face of the base contact layer being positioned lower than an upper face of the source layer to define a base trench,
a portion of the source electrode being filled into the base trench, and
an impurity concentration profile of the base contact layer along a direction perpendicular to the upper face of the semiconductor substrate being highest at the upper face of the base contact layer, having a local minimum value at a position other than the upper face and a lower face of the base contact layer, and having a local maximum value at a position lower than the position of the local minimum value.

20. The device according to claim 19, wherein the value of a ratio of $L/C_{min}$ of the impurity concentration profile is no more than $6 \times 10^{-16}$ cm$^4$, where $C_{min}$ in cm$^{-3}$ is the local minimum value and L in cm is a distance between the position of the local minimum value and the position of the local maximum value.

* * * * *